United States Patent
Barsilai (10) Patent No.: US 9,384,850 B2
(45) Date of Patent: Jul. 5, 2016

(54) OTP READ SENSOR ARCHITECTURE WITH IMPROVED RELIABILITY

(71) Applicant: Texas Instruments Incorporated, Dallas, TX (US)

(72) Inventor: Mandy Barsilai, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/789,666

(22) Filed: Jul. 1, 2015

(65) Prior Publication Data

US 2016/0005492 A1    Jan. 7, 2016

Related U.S. Application Data

(60) Provisional application No. 62/020,078, filed on Jul. 2, 2014.

(51) Int. Cl.
*G11C 17/12* (2006.01)
*G11C 17/08* (2006.01)

(52) U.S. Cl.
CPC ..................... *G11C 17/08* (2013.01)

(58) Field of Classification Search
USPC ............................ 365/104, 189.09
See application file for complete search history.

(56) References Cited

U.S. PATENT DOCUMENTS

| 7,342,836 | B2* | 3/2008 | Taheri | G11C 14/00 365/189.05 |
|---|---|---|---|---|
| 8,817,517 | B2* | 8/2014 | Daigle | G11C 17/18 365/100 |
| 2011/0026354 | A1* | 2/2011 | Lin | G11C 8/12 365/226 |
| 2011/0044074 | A1* | 2/2011 | Reinberger | H02M 3/3376 363/21.02 |

* cited by examiner

*Primary Examiner* — Hoai V Ho
*Assistant Examiner* — Minh Dinh
(74) *Attorney, Agent, or Firm* — Gregory J. Albin; Frank D. Cimino (57) ABSTRACT

Circuits and methods for reading an OTP memory cell with improved reliability. To read a first OTP memory cell, a first current amount generated by a second, programmed, OTP memory cell is received. A second current amount generated by a third, unprogrammed, OTP memory cell is received. Current generated by the first OTP memory cell is sunk. The amount of current sunk from the first OTP memory cell is equal to a sum of a third current amount that is proportional to the first current amount plus a fourth current amount that is proportional to the second current amount. While sinking said current from the first OTP memory cell a voltage at a current output of the first OTP memory cell is compared to a threshold voltage.

20 Claims, 7 Drawing Sheets

FIG. 5B

OTP READ SENSOR ARCHITECTURE WITH IMPROVED RELIABILITY

CROSS-REFERENCE TO RELATED APPLICATIONS

This application claims priority under 35 U.S.C. §119 to U.S. Provisional Patent Application 62/020,078 for NEW ARCHITECTURE TO IMPROVE RELIABILITY OF OTP READ SENSORS, filed on Jul. 2, 2014, the contents of which are hereby incorporated herein by reference.

BACKGROUND

One-time programmable (OTP) memories are an increasingly important component of modern electronics. Typically, OTP memories require a bias current to perform the read operation. In older, well controlled processes, the allowable ratio of the on-current of the OTP memory cell to the bias current can be 10/1 or greater. In newer (leaky) processes, the allowable bias current ratio can be as low as 3/1 and is shrinking. Tightening ranges require a precision current reference to maintain a reliable read function.

Figure 1A:
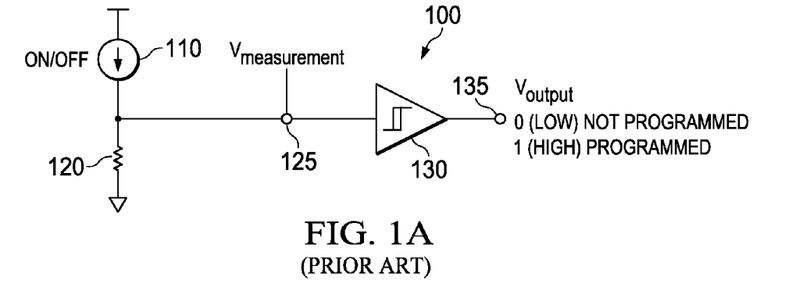
FIG. 1A is a schematic circuit diagram illustrating a prior art OTP bit measurement circuit 100.

FIG. 1A is a schematic circuit diagram illustrating a prior art OTP bit measurement circuit 100. Circuit 100 includes an OTP bit memory element 110 comprising a programmable current source. The programmable current source 110 is coupled to a resistor 120, the other end of which is coupled to ground. The OTP bit memory element 110 is also coupled at a node $V_{measurement}$ 125 to an input of a comparator 130, which compares $V_{measurement}$ to a threshold voltage. An output of the comparator 130 is coupled to a $V_{output}$ node 135. For more information about OTP sensors themselves, please see, for example, "COP8&L88GW microCMOS One-Time Programmable (OTP) Microcontroller," Literature Number SNOS782A, Copyright 2011, Texas Instruments Incorporated, which is hereby incorporated by reference in its entirety.

In operation, the OTP bit memory element 110 is programmed either as an "on" (programmed) state, representing a digital value of 1, or an "off" (unprogrammed) state, representing a digital value of 0. If the OTP bit memory element 110 is programmed as an "off," or "not programmed," state, substantially no, or very little current flows from the OTP bit memory element 110 through the resistor 120, and therefore $V_{measurement}$ node 125 is pulled to ground by resistor 120 and therefore the comparator 130 outputs a logical 0. If, on the other hand, the OTP bit memory element 110 is programmed as "on," or "programmed," the bit memory element produces a set amount of current that flows through the resistor 120, and therefore $V_{measurement}$ node 125 approaches a voltage proportional to the current of the OTP bit memory 110, and therefore the comparator 130 outputs a logical "1." The power supply voltage $V_{DD}$ is generally product and process dependent, but can be, for example, 3.6V.

Figure 1B:
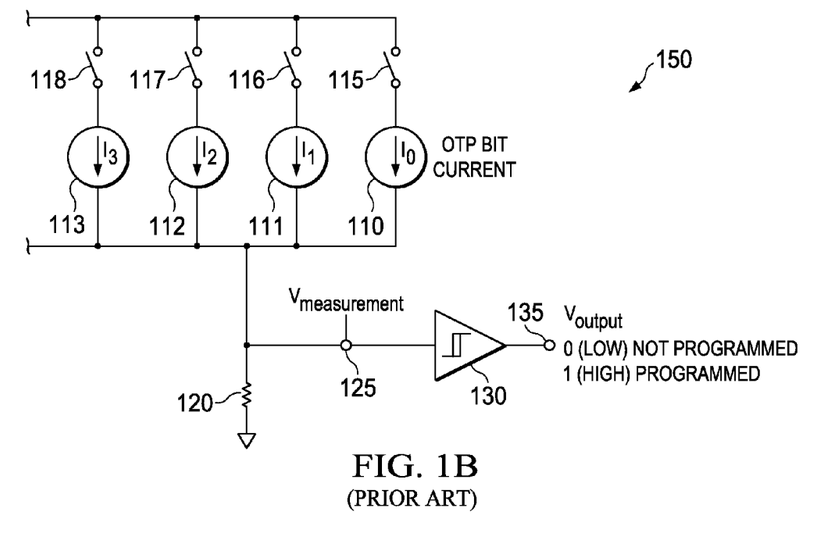
FIG. 1B is a schematic drawing illustrating an array of OTP bit memory elements selectively coupleable to be read by a comparator.

FIG. 1B illustrates an array 150 of OTP bit memory elements 110-113 that are selectively coupleable to be read by the comparator 130. In the array 150, an OTP bit memory element 110-113 can be selectively coupled to the resistor 120 and the comparator 130 through its corresponding switch 115-118.

Figure 1C:
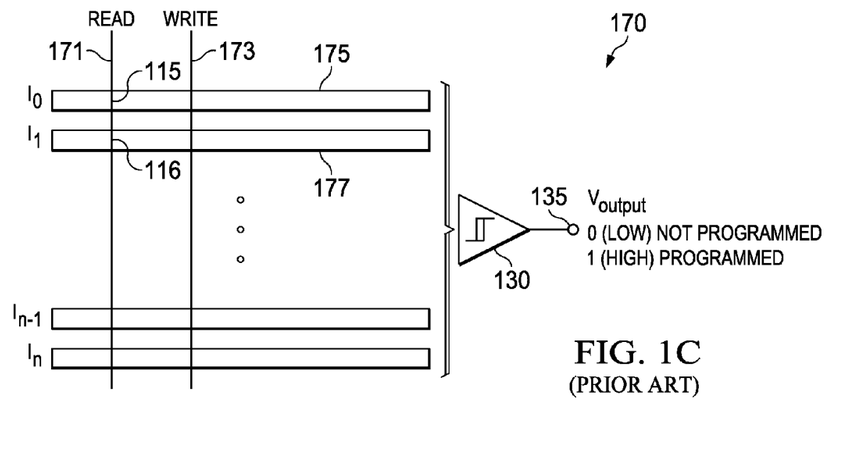
FIG. 1C is a schematic drawing illustrating an array comprising a plurality of rows of OTP bit memory elements.

FIG. 1C illustrates an array 170 comprising a plurality of rows 175, 177 of OTP bit memory elements. The array 170 is a densely packed arrangement of minimum sized PMOS floating gate devices (i.e. OTP cells). Each row 175, 177 represents a data word and includes a number, for example, 8, of bit memory elements. The array includes a read line 171 and a write line 173 for each bit position. Thus, in an architecture that uses 8-bit words, the array 170 includes 8 read lines and 8 write lines. Each row 175, 177 has an associated wordline (not shown). Each wordline is coupled to all of the gates in its associated row. Thus activating/deactivating the wordline turns on/off all of the transistors in that row. When a given wordline is activated, each read/write line 171, 173 only operates on the corresponding bit of the selected row each read/write line 171, 173 is a shared bus amongst all the words. The read/write lines 171, 173 are used by an array of sense amplifiers connected to each read/write line to write data to and read data from the bit memory cells.

There are problems with the circuits 100, 150, and 170 of FIGS. 1A-1C that rely upon the resistor 120. For example, due to a constant current bleed through the resistor 120, the resistor 120 value does not track the variation of the OTP bit memory element for either programmed or unprogrammed states. Also, the size of the resistor 120 must be precise. Typically, the value of the resistor 120 is set by the supply voltage and the maximum $I_{off}$ current of the bit memory element, such as might be seen from an unprogrammed OTP. For example, in some example implementations, the resistance of resistor 120 is set as $R=V_{DD}/(2*I_{off\_max})$. Finally, the lifetime data retention has no tracking between the 'read resistor' and the OTP current values. Therefore, there is a need in the art to address at least some of the issues associated with conventional OTP bit measurement circuits.

SUMMARY

Illustrative embodiments of this disclosure are directed to a one-time programmable (OTP) memory cell read circuit having an OTP bit memory element, a programmed-on OTP reference cell, a first current mirror, a programmed-off OTP reference cell, a second current mirror and a comparator. The OTP bit memory element stores a data bit. The programmed-on OTP reference cell generates a first reference current. The first current mirror has a first input coupled to receive the first reference current and a second input coupled to a current output of the OTP bit memory element. The first current mirror sinks current from the OTP bit memory element. The amount of current the first current mirror sinks from the OTP bit memory element is proportional to the first reference current. The programmed-off OTP reference cell generates a second reference current. The second current mirror has a first input coupled to receive the second reference current and a second input coupled to the current output of the OTP bit memory element. The second current mirror sinks current from the OTP bit memory element. The amount of current the second current mirror sinks from the OTP bit memory element is proportional to the second reference current. The comparator compares the voltage at the current output of the OTP bit memory element to a threshold voltage and outputs a logical "1" if said voltage is higher than the threshold voltage, and outputs a logical "0" if said voltage is lower than the threshold voltage.

Other embodiments of the present disclosure are directed to an apparatus having a first reference OTP cell, a first current mirror, a second reference OTP cell, a second current mirror, a programmable OTP bit memory element, and a comparator. The first OTP cell generates a reference bias current in a programmed-on configuration. The first current mirror has a first input coupled to an output of the first reference OTP cell. The second reference OTP cell generates a reference bias current in a programmed-off configuration. The second current mirror has a first input coupled to an output of the second reference OTP cell. The programmable OTP bit memory element has an output coupled to a second input of the first current mirror and a second input of the second current mirror. The comparator has an input coupled to the output of the programmable OTP bit memory element.

Other embodiments of the present disclosure are directed to methods of reading a first OTP memory cell. In an illustrative method, a first current amount generated by a second, programmed, OTP memory cell is received. A second current amount generated by a third, unprogrammed, OTP memory cell is received. Current generated by the first OTP memory cell is sunk. The amount of current sunk from the first OTP memory cell is equal to a sum of a third current amount that is proportional to the first current amount plus a fourth current amount that is proportional to the second current amount. A voltage at a current output of the first OTP memory cell is then compared to a threshold voltage.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 2:
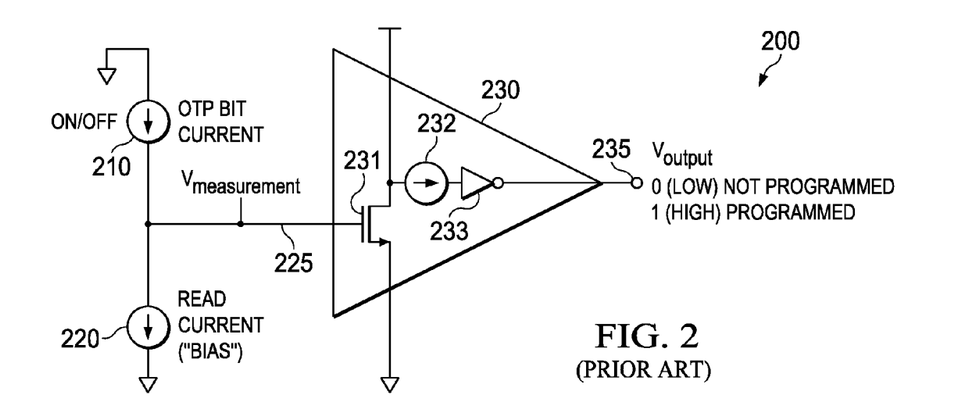
FIG. 2 is a schematic circuit diagram illustrating a prior art OTP bit measurement circuit that uses a bandgap style reference to create a reference current.

FIG. 2 is a schematic circuit diagram illustrating a prior art OTP bit measurement circuit 200 that uses a bandgap style reference to create a reference current. Circuit 200 includes an OTP bit memory element OTP bit memory element 210 comprising a programmable current source. The programmable current source 210 is coupled to a current source 220, the other end of which is coupled to ground. The current source 220 generates a read current, or bias current, and serves as a current sink. In the circuit 200, the "on" current of the OTP bit memory element 210 is several times greater in magnitude than the bias current of the read current sink 220, illustratively a factor of ten or a hundred times greater. The OTP bit memory element 210 is also coupled at a node $V_{measurement}$ 225 to an input of a comparator 230, which compares $V_{measurement}$ to a threshold voltage. An output of the comparator 230 is coupled to a $V_{output}$ node 235.

The comparator 230 includes an n-channel field-effect transistor (NFET) 231 whose gate is coupled to the $V_{measurement}$ node 225, whose drain is coupled to a current source 232 and a high voltage rail, and whose source is coupled to ground. The comparator 230 also includes an inverter 233 coupled to receive an output of the current source 232. The output of inverter 233 is coupled to the output node 235.

In operation, the OTP bit memory element 210 is programmed either as an "on" (programmed) state, representing a digital value of 1, or an "off" (unprogrammed) state, representing a digital value of 0. If the OTP bit memory element 110 is programmed as an "off," or "not programmed," state, substantially no, or very little (perhaps a few nanoamperes) current flows from the OTP bit memory element 110 through the read current source 220, and therefore $V_{measurement}$ node 225 is at a ground voltage, and therefore the comparator 230 outputs a logical 0.

If, on the other hand, the OTP bit memory element 210 is programmed as "on," or "programmed," the maximum current through the OTP bit memory element 210 is significantly higher than the maximum amount for which the read current sink 220 is configured. Therefore, a voltage across the read current sink 220 quickly approaches a maximum voltage differential (set by the power supply $V_{DD}$) allowable across both the OTP bit memory element 210 and the read current sink 220 in series, driving the $V_{measurement}$ node 225 close to a high voltage rail, thus driving the $V_{output}$ node 235 high.

The bandgap read current sink 220 has some problems associated with it. For example, bandgaps can be large in area, use significant current, require extra devices (such as bipolar devices) in the design, and can have significant start-up time requirements.

Figure 3:
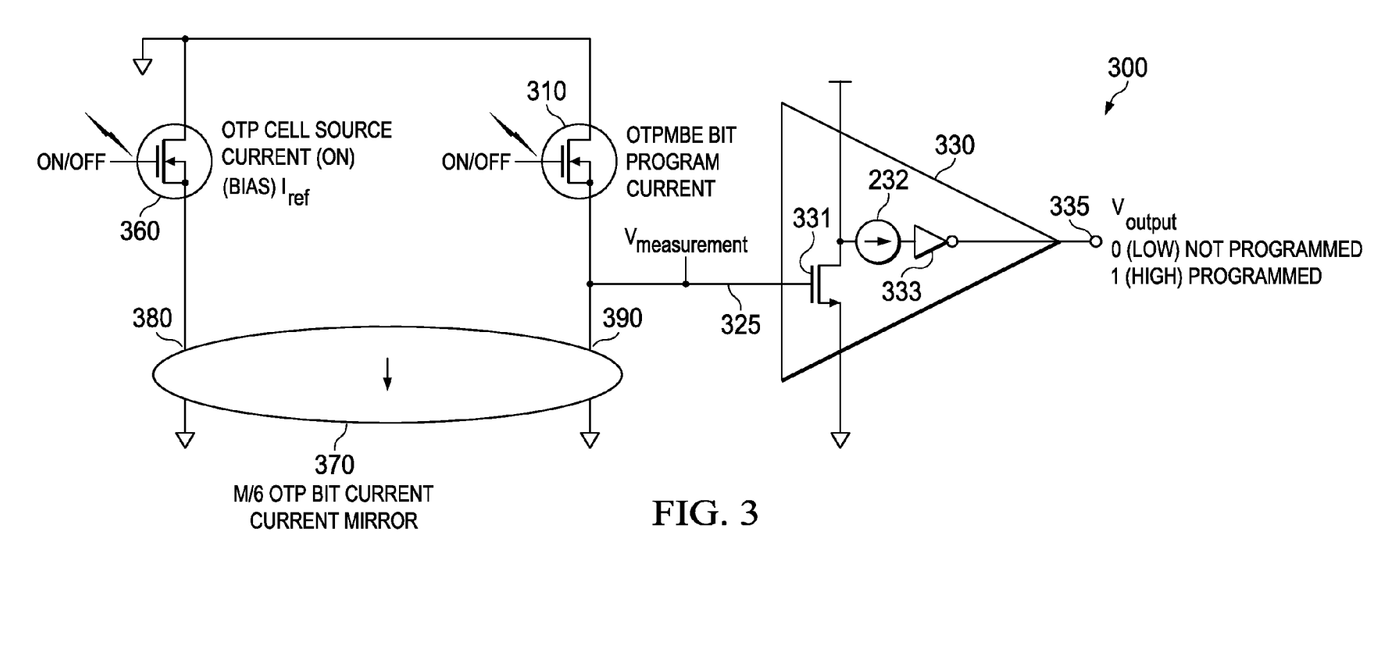
FIG. 3 is a schematic circuit diagram illustrating an OTP bit measurement circuit that uses an OTP reference cell and a current mirror to generate a read bias current.

FIG. 3 is a schematic circuit diagram illustrating an OTP bit measurement circuit 300 that uses an OTP reference cell and a current mirror to generate a read bias current. The circuit of FIG. 3 is disclosed in U.S. Pat. No. 8,929,121, entitled "REFERENCE AND READ OTP SENSORS," issued on Jan. 6, 2015, having named inventors Brett E. Forejt and David J. Baldwin, and assigned to Texas Instruments Incorporated, the entire contents of which are hereby incorporated herein by reference. The OTP bit measurement circuit 300 of FIG. 3 addresses some of the previously mentioned issues associated with the prior art. In the circuit 300, a second OTP cell 360 generates the bias current during a read operation of the OTP bit memory element. Unlike prior methods of generating a read bias current in an OTP read circuit, which use unmatched sources such as resistors, bandgap current sources, and other well-known current source methods, the OTP bit measurement circuit 300 generates a reference current using a second OTP cell 360 to drive a $V_{measurement}$ node 325.

The circuit 300 uses a second OTP cell 360, manufactured in a substantially identical manner as the OTP bit memory element 310, to generate the read/bias current for OTP bit memory element 310, and therefore is intrinsically more robust and can also be far more straightforward to implement. It is smaller than all but perhaps the simplest prior art which is the resistor.

The OTP bit measurement circuit 300 of FIG. 3 includes an OTP bit memory element 310 comprising a programmable current source 310. In the embodiment shown in FIG. 3, the OTP bit memory element 310 comprises an n-channel metal-oxide-semiconductor field-effect transistor (aka n-channel MOSFET, NFET, or NMOS). The gate of the NFET 310 receives an on/off programming signal. The drain of the NFET 310 is coupled to a power supply $V_{DD}$. The source of the NFET 310 is coupled to the $V_{measurement}$ input 325 of comparator 330 and also to an input 390 of a current mirror circuit 370. The OTP bit memory element 310 is also coupled at a node $V_{measurement}$ 325 to an input of a comparator 330, which compares $V_{measurement}$ to a threshold voltage. An output of the comparator 330 is coupled to a $V_{output}$ node 335. The comparator 330 includes an n-channel field-effect transistor (NFET) 331 whose gate is coupled to the $V_{measurement}$ node 325, whose drain is coupled to a current source 332 and a high voltage rail, and whose source is coupled to ground. The comparator 330 also includes an inverter 333 coupled to receive an output of the current source 332. The output of inverter 333 is coupled to the output node 335.

Reference OTP cell 360 generates a reference (bias) current that is provided to an input 380 of the current mirror circuit 370. The OTP reference cell is programmed in the "on," or "programmed," state, and thus generates current at a level corresponding to that of a programmed OTP bit memory element. In the embodiment shown in FIG. 3, the reference OTP cell 360 comprises a programmed-on NFET, i.e., an NFET that has been charged by running high amounts of current through it. The drain of the NFET 360 is coupled to a power supply $V_{DD}$. The source of the NFET 360 is coupled to an input 380 of a current mirror circuit 370.

In operation, the programmed-on reference OTP cell 360 generates a bias current. This bias current is provided to a first input 380 of the current mirror circuit 370. The current mirror circuit 370 then mirrors and divides down the current received from the reference OTP cell 360. In the illustrative implementation shown in FIG. 3, current mirror 370 divides the current down by a factor of six, but it will be appreciated that other factors can be used as well. A second input 390 to the current mirror 370 serves as a current sink and is coupled between an output of the OTP bit memory element 310 and ground. If the OTP bit memory element 310 is programmed as "off," then the OTP bit memory element 310 will not generate substantial current, the current mirror 370 draws no (or very little) current, and the $V_{measurement}$ node 325 is driven towards ground, thus causing the comparator 330 to output a logical "0." On the other hand, if the OTP bit memory element 310 is programmed as "on," then the OTP bit memory element 310 will generate substantial current. Since the reference OTP cell 360 and the OTP bit memory element 310 both generate equal amounts of current if the OTP bit memory element is programmed "on," the amount of current that the second input 390 of the current mirror 370 is configured to be able to sink is only a fraction (⅙ in the implementation of FIG. 3) of the current generated by the programmed-on OTP bit memory element 310. Therefore, a voltage across the read current sink of the current mirror 370 quickly approaches a maximum voltage differential allowable across both the OTP cell 310 and the read current sink in series, thus causing the comparator 330 to output a logical "1."

With older process technologies, the current produced by a programmed-on OTP bit memory element could be several orders of magnitude higher than that of a coupled current sink (such as the current sink 220 of FIG. 2). However, as process technologies have advanced, the current generated by programmed-on OTP programmable bit elements has dropped, so that the current generated by the OTP bit memory element and the bias current sink are within an order of magnitude of each other, creating problems for the comparator, especially considering such factors as manufacturing variability again of elements, and overall different behaviors of CMOS transistors (used in logic) and bipolar junction transistor (BJT) transistors (typically used in analog).

Biasing the OTP bit memory element 310 with current generated by a second, programmed-on, OTP memory cell 360 mitigates some of the variability inherent in using two different current sourcing technologies to generate the on-state current of the OTP bit memory element 310 and the bias current used in reading the OTP bit memory element 310. For example, since the bias current is generated using an OTP memory cell 360, fluctuations in the on-state current of the OTP bit memory element 310 caused by process variances tend to be accompanied by substantially equal fluctuations in the reference current generated by the reference OTP cell 360, which in turn tends to be accompanied by proportional fluctuations in the current that is sunk at the input 390 of the current mirror. Therefore, the ratio of the current of a programmed-on OTP bit memory element 310 to the bias current sunk at input 390 of the current mirror tends to remain substantially constant (a ratio of 6/1 in the illustrative implementation of FIG. 3). This significantly decreases the demands on the comparator 330 in distinguishing between an on-state and an off-state of the OTP bit memory element 310 in the face of process variances.

However, due to statistical variations of the reference current generated by a reference OTP cell, such as OTP cell 360, with respect to the OTP cells, such as OTP bit memory element 310, setting the voltage threshold of the comparator 330 to accurately distinguish between a programmed OTP cell and an unprogrammed OTP cell can be difficult even when using the bias generation scheme described with respect to FIG. 3. This problem is exacerbated by the OTP cell degradation with time, which increases the likelihood of failure to observe the correct state of the OTP cell. Furthermore, the scheme described with respect to FIG. 3 fails to address the situation wherein an OTP bit memory element that is programmed "off" is generating significant amounts of current due to various process conditions such as high temperatures, etc. If the programmed-off OTP cell is generating an amount of current that exceeds the amount of current that the current sink at the input 390 of the current mirror 370 is configured to sink (i.e., the divided-down reference current generated by the reference OTP cell 360), the voltage across the read current sink can quickly exceed the threshold voltage of the comparator 330 and therefore give a false "programmed-on" reading. In order to address these limitations of the scheme described with respect to FIG. 3, aspects of the present disclosure employ not one but two reference OTP cells, one programmed "on" and one programmed "off," to generate the read bias current. The total bias current used to read the OTP bit memory element is the sum of the divided-down reference current generated by the programmed-on reference OTP cell plus the reference current (also possibly divided down by some predetermined amount) generated by the programmed-off reference OTP cell.

Figure 4A:
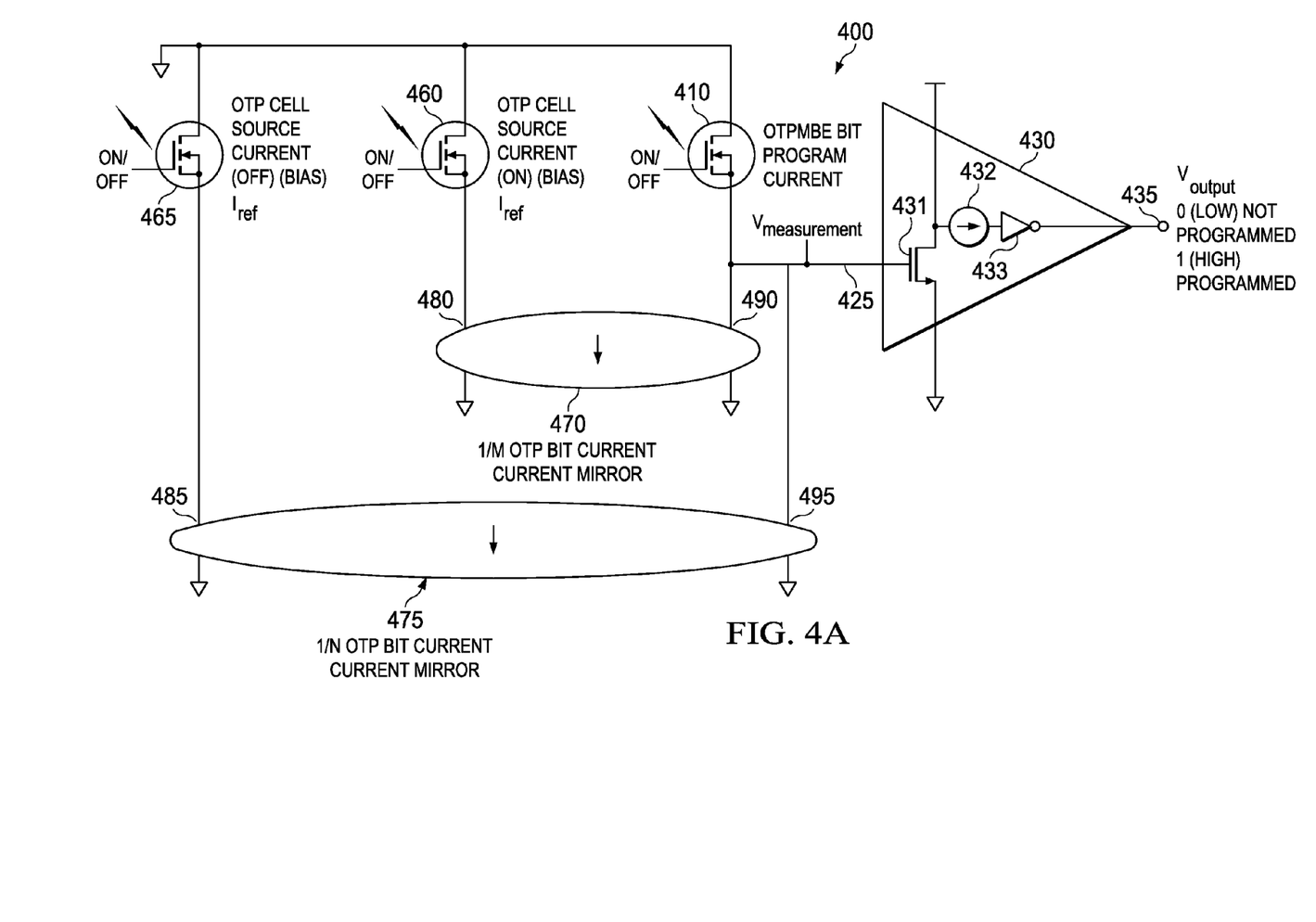
FIG. 4A is a schematic circuit diagram illustrating an OTP bit measurement circuit that uses a programmed-on OTP reference cell and a programmed-off OTP reference cell to generate a read bias current.

FIG. 4A is a schematic circuit diagram illustrating an OTP bit measurement circuit 400 that uses a programmed-on OTP reference cell and a programmed-off OTP reference cell to generate a read bias current. The OTP bit measurement circuit 400 of FIG. 4 addresses some of the previously described shortcomings associated with the OTP bit measurement circuit 300 of FIG. 3.

The OTP bit measurement circuit 400 of FIG. 4A includes an OTP bit memory element 410 comprising a programmable current source 410. In the embodiment shown in FIG. 4A, the OTP bit memory element 410 comprises an n-channel field-effect transistor (NFET), but it is to be understood that the OTP bit memory element 410 could also be implemented using other semiconductor technologies, such as a p-channel field-effect transistor (PFET). The gate of the NFET 410 receives an on/off programming signal. The drain of the NFET 410 is coupled to a power supply $V_{DD}$. The source of the NFET 410 is coupled to the $V_{measurement}$ input 425 of comparator 430 and also to an input 490 of a current mirror circuit 470 and to an input 495 of a second current mirror circuit 475. The OTP bit memory element 410 is also coupled at a node $V_{measurement}$ 425 to an input of a comparator 430, which compares $V_{measurement}$ to a threshold voltage. An output of the comparator 430 is coupled to a $V_{output}$ node 435. The comparator 430 includes an n-channel field-effect transistor (NFET) 431 whose gate is coupled to the $V_{measurement}$ node 425, whose drain is coupled to a current source 432 and a high voltage rail, and whose source is coupled to ground. The comparator 430 also includes an inverter 433 coupled to receive an output of the current source 432. The output of inverter 433 is coupled to the output node 435.

A programmed-on reference OTP cell 460 generates a reference (bias) current during a read operation of the OTP bit memory element 410. The reference current generated by the programmed-on reference OTP cell 460 is provided to an input 480 of a current mirror circuit 470, in a manner similar to the reference OTP cell 360 of FIG. 3. Since the OTP reference cell 460 is programmed in the "on," or "programmed," state, it generates current at a level corresponding to that of a programmed OTP bit memory element. In the embodiment shown in FIG. 4, the reference OTP cell 460 comprises a programmed-on NFET, i.e., an NFET that has been charged by running high amounts of current through it. The drain of the NFET 460 is coupled to a power supply $V_{DD}$. The source of the NFET 460 is coupled to an input 480 of the current mirror circuit 470.

The current mirror 470 includes a current source coupled between the input 490 of the current mirror and ground. This current source serves as a current sink to the OTP bit memory element 410. The magnitude of the current source at input 490 of the current mirror is based on the amount of current that the current mirror 470 receives at input 480 from the programmed-on reference OTP cell 460. In an illustrative embodiment, the current mirror divides the amount of current received from the programmed-on reference OTP cell 460 by a predetermined factor M, and sinks that divided-down amount of current at input 490.

A programmed-off reference OTP cell 465 generates a reference (bias) current during a read operation of the OTP bit memory element 410. The reference current generated by the programmed-off reference OTP cell 465 is provided to an input 485 of a second current mirror circuit 475. Since the OTP reference cell 465 is programmed in the "off," or "not programmed," state, it generates current at a level corresponding to that of an unprogrammed OTP bit memory element. In the embodiment shown in FIG. 4, the reference OTP cell 465 comprises a programmed-off NFET, i.e., an NFET that has not been charged by running high amounts of current through it. The drain of the NFET 465 is coupled to a power supply $V_{DD}$. The source of the NFET 465 is coupled to an input 485 of the current mirror circuit 475. While the reference OTP cells 460 and 465 are illustrated in FIG. 4 as NFET devices, it is to be understood that the reference OTP cells 460 and 465 could also be implemented using other semiconductor technologies, such as a p-channel field-effect transistors (PFETs).

The current mirror 475 includes a current source coupled between the input 495 of the current mirror and ground. This current source serves as a current sink to the OTP bit memory element 410. The magnitude of the current source at input 495 of the current mirror is based on the amount of current that the current mirror 475 receives at input 485 from the programmed-off reference OTP cell 465. In an illustrative embodiment, the current mirror divides the amount of current received from the programmed-off reference OTP cell 465 by a predetermined factor N, and sinks that divided-down amount of current at input 495. In one specific embodiment, the magnitude of the current source at input 495 of the current mirror is equal to the amount of current that the current mirror 475 receives at input 485 from the programmed-off reference OTP cell 465. In other words, in this specific embodiment, the dividing-down factor N=1, i.e., the current is not divided down at all. In other embodiments, the amount of current received by the current mirror 475 is actually multiplied (increased) by a certain factor to determine the amount of current sunk at the input 495 of current mirror 475. In such embodiments, the dividing-down factor N is a number less than one.

Thus it can be seen that the total bias current seen by the OTP bit memory element is the sum of the bias current sunk at the input 490 of current mirror 470 (based on the current generated by the programmed-on reference OTP cell 460) plus the bias current sunk at the input 495 of current mirror 475 (based on the current generated by the programmed-off reference OTP cell 465). Defining the reference current generated by the programmed-on reference OTP cell 460 as $I_{ref-on}$ and the reference current generated by the programmed-off reference OTP cell 465 as $I_{ref-off}$ the total bias current $I_{bias}=I_{ref-on}/M+I_{ref-off}/N$. In most embodiments, M is greater than N, and thus $I_{ref-on}$ is divided down more than is $I_{ref-off}$, but substantially any combination of values for M and N can be used. In one specific embodiment, M=N and $I_{ref-on}$ and $I_{ref-off}$ are divided down equally. In another specific embodiment, N<1 and M=∞ (infinity). In other words, in this embodiment, the amount of the programmed-on reference current generated by OTP cell 460 is not factored into the total amount of current that bias current that is sunk from the OTP bit memory element 410, and the total amount of bias current is determined solely by multiplying the programmed-off reference current generated by reference OTP cell 465 by 1/N (where N<1).

If the OTP bit memory element 410 is programmed as "on," then the OTP bit memory element 410 will generate substantial current. The reference OTP cell 460 and the OTP bit memory element 410 both generate equal amounts of current if the OTP bit memory element is programmed "on." This amount of current is generated by the programmed-on reference OTP cell 460 and divided down by a predetermined factor M by the current mirror 470. This divided-down current amount is sunk from the OTP bit memory element 410 at the input 490 of the current mirror. The amount of reference current generated by the programmed-off reference OTP cell 465 is ideally zero, but in most cases very low relative to the programmed-on current of the OTP bit memory element. Thus the total amount of current that the input 490 of the current mirror 470 and the input 495 of current mirror 475 are configured to be able to sink is only a fraction of the current generated by the OTP bit memory element 310 in the "on" state. Therefore, a voltage across the read current sinks 490 and 495 of the current mirrors 470, 475 quickly approaches a maximum voltage differential allowable across both the OTP cell 410 and the read current sinks in series, thus causing the comparator 430 to output a logical "1."

If the OTP bit memory element 410 is programmed as "off," then, in normal operation, the OTP bit memory element 410 will not generate substantial current, the current mirrors 470 and 475 draw no (or very little) current, and the $V_{measurement}$ node 425 is driven towards ground, thus causing the comparator 430 to output a logical "0."

In a situation wherein an OTP bit memory element 410 that is programmed "off" is generating significant amounts of current due to various process conditions such as high temperatures, etc., the presence of the programmed-off reference OTP cell 465 helps compensate for that condition. Under a given set of operating conditions, the programmed-off reference OTP cell 465, which illustratively resides on the same integrated circuit chip and was fabricated at the same time as the programmed-off OTP bit memory element 410, will generate substantially the same amount of current as the programmed-off OTP bit memory element 410. Therefore, if the programmed-off OTP bit memory element 410 is generating a substantial amount of current, the programmed-off reference OTP cell 465 will generate substantially the same amount of current. This current amount generated by the programmed-off reference OTP cell 465 is added to the bias current generated by the programmed-on reference OTP cell 460. Thus the total bias current seen by the OTP bit memory element 410 will always be greater than the programmed-off current produced by the OTP bit memory element 410, which substantially reduces the likelihood of incorrectly reading an unprogrammed OTP bit memory element as programmed. Thus it can be seen that creating the reference current of the bit memory element 410 by adding the reference current of the programmed-on reference OTP cell 460 to the reference current of the programmed-off reference OTP cell 465 causes the total reference current to scale in the same proportion as the read current generated by the OTP bit memory element 410. This increases the reliability of the OTP read mechanism over the life of the product.

In an illustrative aspect of the present disclosure, the programmed-on OTP cell source 460, the programmed-off OTP cell source 465 and the OTP bit memory element 410 are manufactured substantially simultaneously, i.e. during the same fabrication steps. Moreover, the programmed-on reference OTP cell 460, the programmed-off reference OTP cell 465 and the OTP bit memory element 410 reside on the same integrated circuit chip and, further, are located in the same area of said integrated circuit chip. For example, in a preferred embodiment the programmed-on OTP cell source 460, the programmed-off OTP cell source 465 and the OTP bit memory element 410 are within 10 microns of each other. Many pairs of programmed-on OTP reference cells, such as cell 460, and programmed-off OTP reference cells, such as cell 465, that are directly adjacent each other can be spread throughout a larger array (100's of words) to provide better matching across an array. Manufacturing the programmed-on reference OTP cells, such as cell 460, and the programmed-off reference OTP cells, such as cell 465, at the same time, i.e., during the same batch, as the OTP bit memory elements, such as cell 410 will typically impart distinctive structural characteristics to the circuit 400 that would allow the OTP reference cells to more accurately track the OTP bit memory elements for process, voltage, and temperature, which creates a very robust solution, as these rates would typically map substantially to each other within a same batch, as opposed to prior art devices.

Another advantage of using OTP memory cells to generate the bias current for other OTP memory cells is that no outside source is needed to generate the current. By using programmed OTP bits to generate a reference current for reading an OTP memory cell, a reliable read amplifier can be designed which does not require any outside current reference.

Using OTP memory cells to generate the bias current for other OTP memory cells is also very attractive for large scale digital designs which require non-volatile memory. Even with systems which have a current reference, this solution simplifies the startup sequencing. For example, when using prior art current sources a user would be constrained to wait for the current source/sink to settle before reading. With the present solution, the setting time of a reference current is substantially equal to that of the OTP itself. In other words, the extra complication of having to enable the reference current for the chip just to read the OTP is removed. Also, the OTP reference cells 460 and 465, the current mirror circuits 470 and 475, the OTP bit memory element 410, and the comparator 430 can be all integrated in a single integrated circuit.

Moreover, since OTP memory cells are being used to generate the reference currents, a bias reference current no longer has to be routed into the digital core to an OTP block from the analog world, and therefore the circuit is a self-contained reference using only OTP memory cells and small supporting circuits for the current mirrors.

Additionally, using OTP memory cells to generate the bias current avoids the "cross-boundary" layouts associated with providing analog current into a digital OTP cell, as OTP memory cells are being employed to be both a memory and a reference current for the circuit. Thus a function of a current source is retained, while eliminating the need for a separate, different current source, such as a BJC broadband current source. Also, power is conserved, as CMOS circuits, such as those that use MOSFETs, are typically more power efficient than BJT's. The circuits of FIGS. 3 and 4 also eliminate the need for the logic and control required for enabling and disabling the bias current generation circuits at the appropriate times. The OTP reference cells are simply enabled and then read after a small delay, such as 10 µs.

In addition, unlike prior art current sources, the reference OTP cells 460 and 465 are very small and compact. This change in size, for example, can be several orders of magnitude. By using a pre-programmed OTP bit to generate a reference current for read, a very compact & reliable read amplifier can be designed which does not require any outside reference.

Figure 4B:
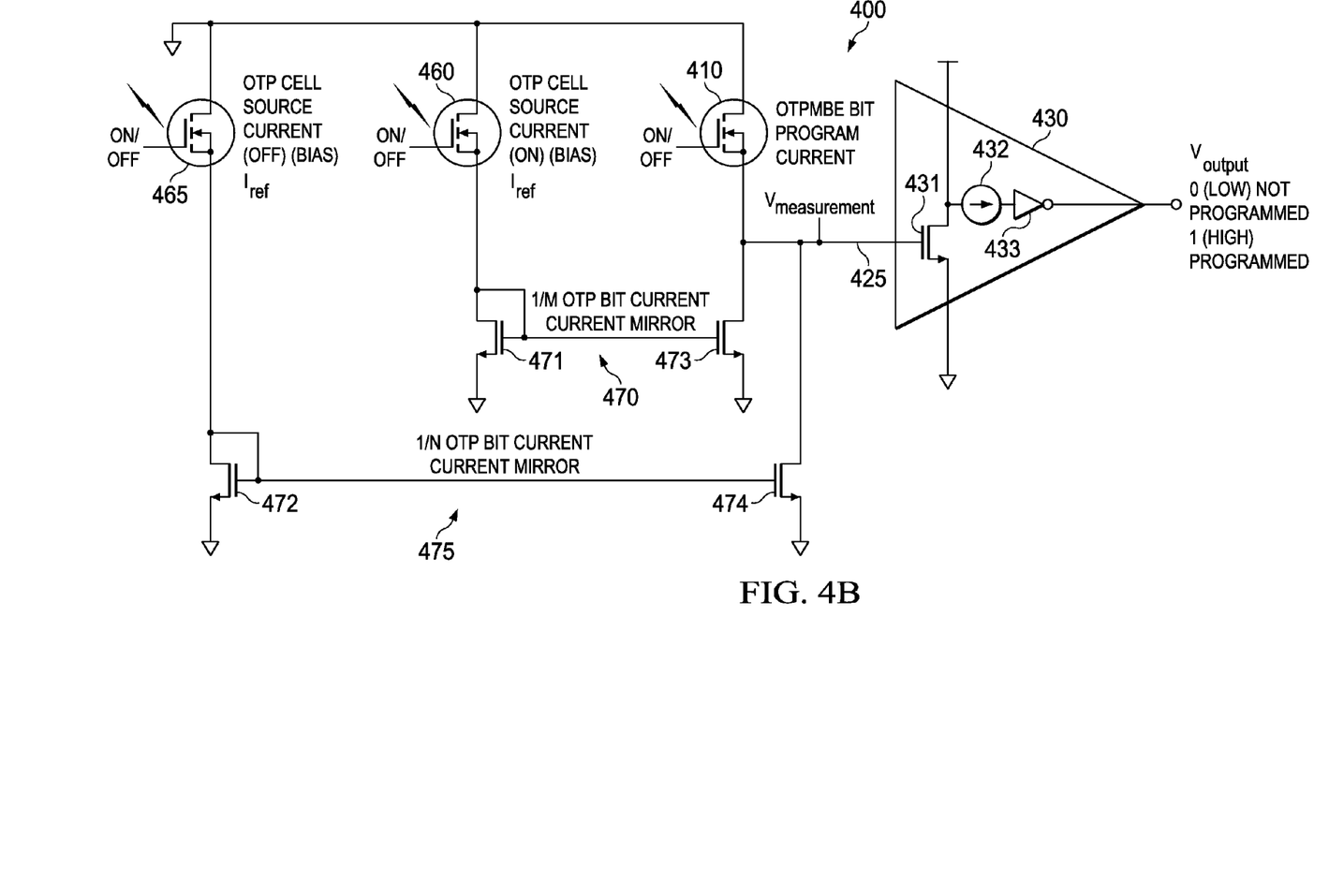
FIG. 4B a schematic circuit diagram of an OTP bit measurement circuit illustrating one embodiment of current mirror circuits.

FIG. 4B illustrates one embodiment of current mirror 470 and current mirror 475 in more detail. In this embodiment, the current mirror 470 includes a first NFET 471 coupled to an output of the programmed-on reference OTP cell 460 that generates a source/reference current. The drain of the first NFET 471 is coupled to the gate of the first NFET 471, and the source of the NFET 471 is coupled to ground. The gate of the first NFET 471 is also coupled to the gate of a second NFET 473. The drain of the second NFET 473 is coupled to an output of the OTP bit memory element 410. The source of the second NFET 473 is coupled to ground. The current mirror 470 effects a dividing-down of the current from the current amount received from the programmed-on reference OTP cell 460 to the level of the drain-to-source current $I_{ds}$ through the NFET 473. The ratio of the current through the first NFET 471 to the current through the second NFET 473 is M/1 (i.e., the current gain is 1/M).

In the embodiment of FIG. 4B, the current mirror 475 includes a first NFET 472 coupled to an output of the programmed-off reference OTP cell 465 that generates a source/reference current. The drain of the first NFET 472 is coupled to the gate of the first NFET 472, and the source of the NFET 472 is coupled to ground. The gate of the first NFET 472 is also coupled to the gate of a second NFET 474. The drain of the second NFET 474 is coupled to an output of the OTP bit memory element 410. The source of the second NFET 474 is coupled to ground. Similar to current mirror 470, the current mirror 475 can effect a dividing-down of the current from the current amount received from the programmed-off reference OTP cell 465 to the level of the drain-to-source current $I_{ds}$ through the NFET 474. The ratio of the current through the first NFET 472 to the current through the second NFET 474 is N/1 (i.e., the current gain is 1/N). In an illustrative embodiment, the ratio of the current through the first NFET 472 to the current through the second NFET 474 is 1/1, i.e., N=1, i.e., the current is neither divided down nor multiplied. Other values of N can also be employed, including N values that are greater than 1, indicating a dividing down of the current, and N values that are less than 1, indicating a multiplying of the current.

In an alternative embodiment of the present disclosure, there is only one current mirror and the reference current generated by the programmed-on reference OTP cell 460 is added to the reference current generated by the programmed-off reference OTP cell 465 to produce a total reference current. This total reference current is then provided to the input to the single current mirror circuit. In single current mirror embodiments, the total reference current is divided down by a predetermined value to determine the bias current that is sunk from the OTP bit memory element. Thus, in these embodiments the reference current produced by the programmed-on reference OTP cell 460 and the reference current produced by the programmed-off reference OTP cell 465 are divided down equally (M=N).

Figure 5A:
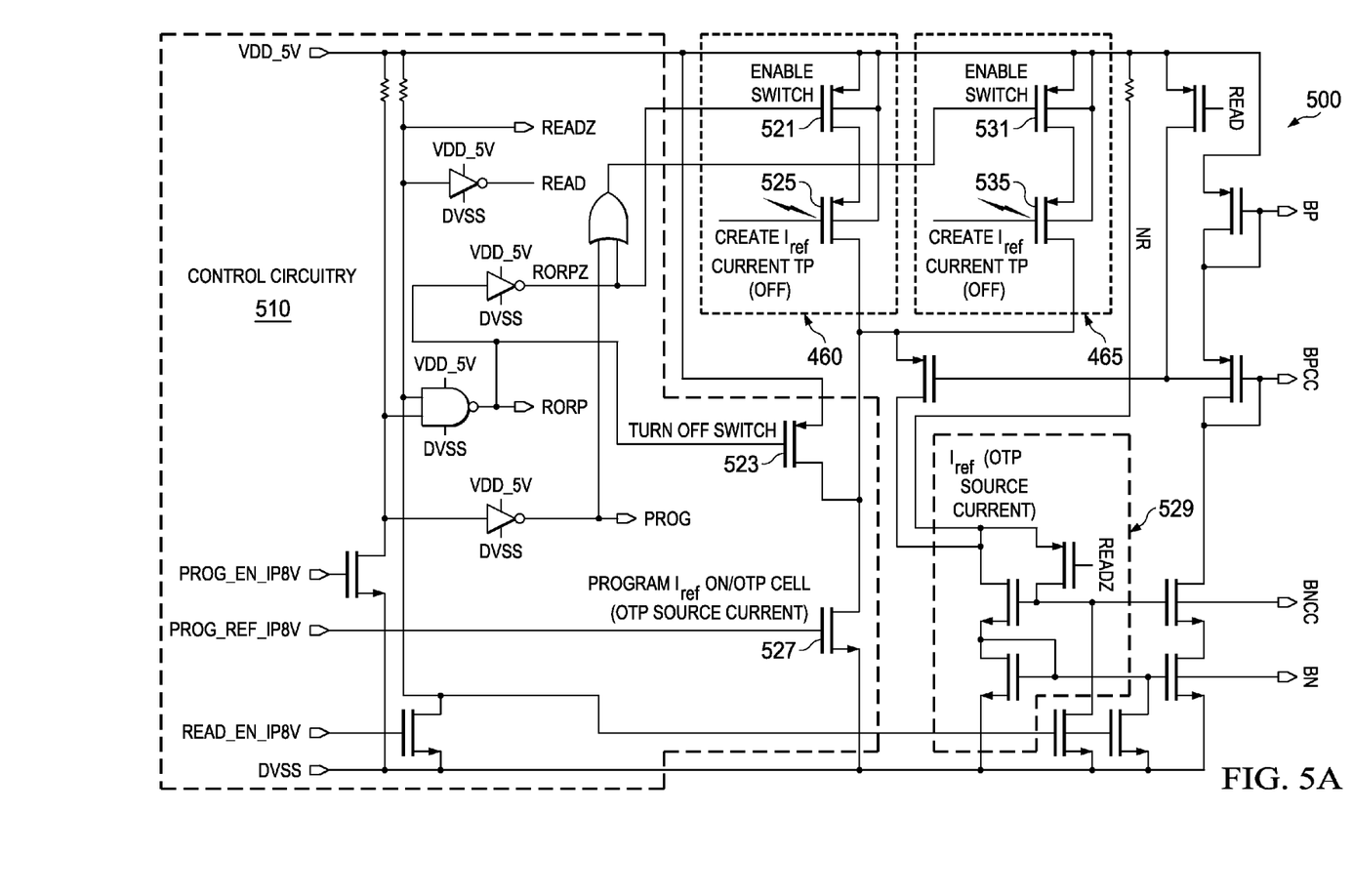
FIG. 5A is a circuit diagram of a reference-OTP-cell side of an illustrative OTP bit measurement circuit having a single current mirror.

FIG. 5A is a circuit diagram of a reference-OTP-cell side 500 of an illustrative OTP bit measurement circuit having a single current mirror. It will be appreciated that FIG. 5A, and FIG. 5B, merely represent an illustrative implementation of a single-current-mirror OTP memory cell read circuit, and that any number of different implementations are possible. In FIG. 5A, elements that are common to FIGS. 4A and 4B are identified with like reference numbers. In the circuit 500, control circuitry 510 is coupled to the programmed-on reference OTP cell 460 and the programmed-off reference OTP cell 465. The programmed-on reference OTP cell 460 includes an enable switch PFET 521 that turns on the OTP cell 460 and a PFET 425 that creates a bias current. The programmed-off reference OTP cell 465 includes an enable switch PFET 531 that turns on the OTP cell 465 and a PFET 535 that creates a bias current. The control circuitry 510 includes a turn-off switch PFET 523 that can turn off the programmed-on reference OTP cell 460 and the programmed-off reference OTP cell 465, and a program switch NFET 527, that programs the PFET 525 of the programmed-on reference OTP cell 460. Note that the cell 535 should not be programmed as it is to remain "off." For this reason, the switch 531 is used to turn off the cell 535 during the burn process of the cell 525. $I_{ref}$ source current circuit 529 is the diode-connected side of a current mirror. $I_{ref}$ source current circuit 529 receives the output current from the PFET 525 of the programmed-on reference OTP cell 460 and the output current from the PFET 535 of the programmed-off reference OTP cell 465. Since the outputs (drains) of the programmed-on PFET 525 and the programmed-off PFET 535 are coupled together, this effects the adding together of the reference current generated by the programmed-on reference OTP cell 460 and the reference current generated by the programmed-off reference OTP cell 465. It will be noted that the $I_{ref}$ source current circuit 529 corresponds roughly to the NFETS 471 and 472 of FIG. 4A. The output signals of the $I_{ref}$ source current circuit 529 are then changed in relative voltages and conveyed to a circuit 550, as described in FIG. 5B.

Figure 5B:
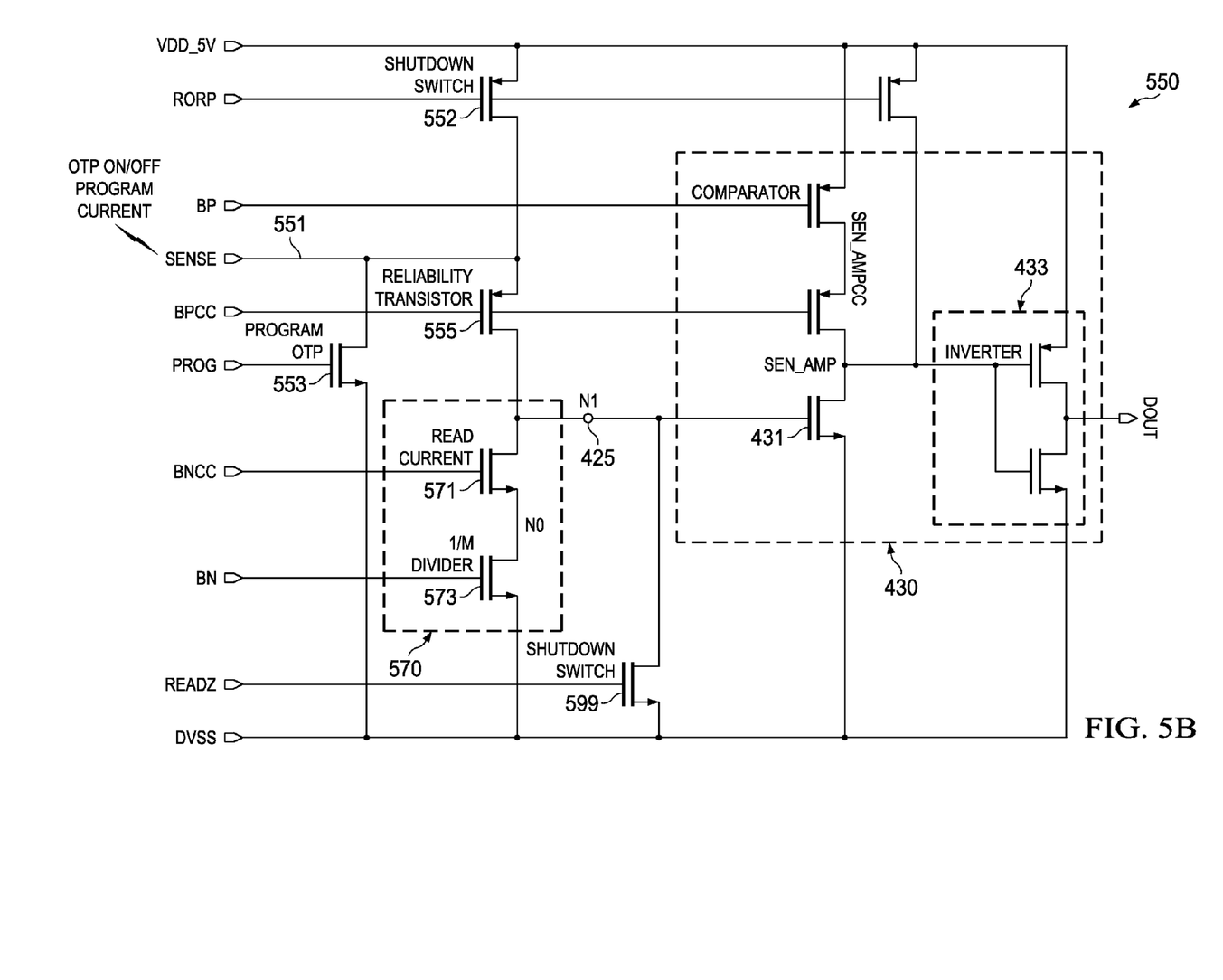
FIG. 5B is a circuit diagram of a OTP bit-memory-element side of an illustrative OTP bit measurement circuit having a single current mirror.

FIG. 5B is a circuit diagram of a OTP bit-memory-element side 550 of an illustrative OTP bit measurement circuit having a single current mirror. Note that a given array of OTP bit memory elements, such as described with respect to FIG. 1C, can have a number of circuits 550, each one corresponding to its own OTP bit memory element 410. The circuit 550 includes a read line 551 that is coupled to a program NFET 553. NFET 553 is the device which is used to program the target OTP bit if desired. The read line 551 is coupled into a source of a shutdown switch 552 and a reliability transistor 555, both of which are PFETs.

A source of the reliability switch 555 is coupled into an input of a current mirror 570, as are a pair of positive and negative signals along BN and BNCC conveyed from the $I_{ref}$ source current circuit 529, i.e., the other (source) side of the current mirror, to a pair of NFETs 571, 573 of the current mirror. The NFETs 571, 573 effect the dividing down of the total reference current (produced by adding $I_{ref\text{-}on}+I_{ref\text{-}off}$) by the dividing-down factor M, as described above. Recall that in the single current mirror implementation, M=N. The drain of NFET 571 corresponds to $V_{measurement}$ node 425 of FIGS. 4A and 4B and is coupled to the input of the comparator 430. A shutdown switch 599 is also coupled to the $V_{measurement}$ node 425 that is coupled to the input of the comparator 430. The comparator 430 includes the NFET 431, which receives the input to the comparator, i.e., $V_{measurement}$ node 425, at its gate. The drain of NFET 431 is coupled to the inverter 433, which in turn provides the output 435 of the comparator 433.

Figure 6:
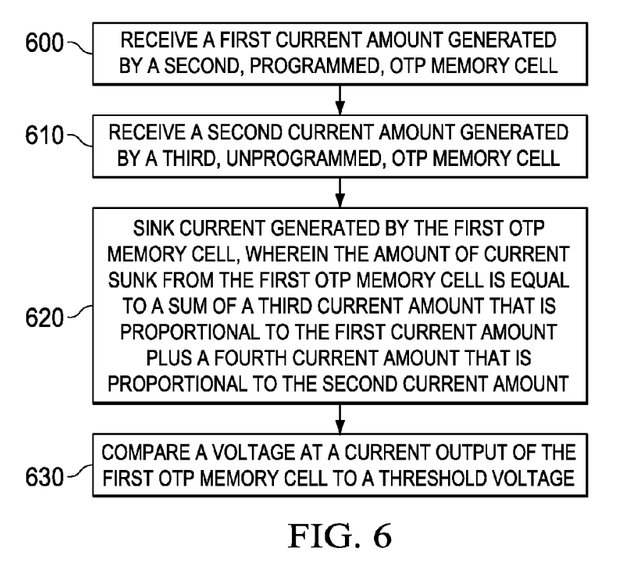
FIG. 6 is a flowchart representing a method of reading a first OTP memory cell.

FIG. 6 is a flowchart representing a method of reading a first OTP memory cell. At block 600, a first current amount generated by a second, programmed, OTP memory cell is received. At block 610, a second current amount generated by a third, unprogrammed, OTP memory cell is received. At block 620, current generated by the first OTP memory cell is sunk. The amount of current sunk from the first OTP memory cell is equal to a sum of a third current amount that is proportional to the first current amount plus a fourth current amount that is proportional to the second current amount. At block 630, a voltage at a current output of the first OTP memory cell is compared to a threshold voltage.

It is noted that the embodiments disclosed herein are illustrative rather than limiting in nature and that a wide range of variations, modifications, changes, and substitutions are contemplated in the foregoing disclosure. Furthermore, in some instances, some features may be employed without a corresponding use of the other features. Accordingly, it is appropriate that the appended claims be construed broadly and in a manner consistent with the broad inventive concepts disclosed herein.

What is claimed is:

1. A one-time programmable (OTP) memory cell read circuit comprising:
   an OTP bit memory element operable to store a data bit;
   a programmed-on OTP reference cell operable to generate a first reference current;
   a first current mirror having a first input coupled to receive the first reference current, and having a second input coupled to a current output of the OTP bit memory element and operable to sink current from the OTP bit memory element, wherein the amount of current the first current mirror sinks from the OTP bit memory element is proportional to the first reference current;
   a programmed-off OTP reference cell operable to generate a second reference current;
   a second current mirror having a first input coupled to receive the second reference current, and having a second input coupled to the current output of the OTP bit memory element and operable to sink current from the OTP bit memory element, wherein the amount of current the second current mirror sinks from the OTP bit memory element is proportional to the second reference current; and a comparator operable to compare the voltage at the current output of the OTP bit memory element to a threshold voltage, and operable to output a logical "1" if the voltage is higher than the threshold voltage, and operable to output a logical "0" if the voltage is lower than the threshold voltage.

2. The OTP memory cell read circuit of claim 1, wherein the first current mirror comprises a first field-effect transistor (FET) coupled to receive the first reference current and a second FET coupled to the current output of the OTP bit memory element, and wherein the gate of the first FET is coupled to the gate of the second FET, and wherein the second current mirror comprises a third FET coupled to receive the second reference current and a fourth FET coupled to the current output of the OTP bit memory element, and wherein the gate of the third FET is coupled to the gate of the fourth FET.

3. The OTP memory cell read circuit of claim 1, wherein the amount of current the first current mirror sinks from the OTP bit memory element is equal to the amount of the first reference current divided by a factor M, and wherein the amount of current the second current mirror sinks from the OTP bit memory element is equal to the amount of the second reference current divided by a factor N.

4. The OTP memory cell read circuit of claim 3, wherein N<1, and M=∞.

5. The OTP memory cell read circuit of claim 1, wherein the OTP bit memory element, the programmed-on OTP reference cell, and the programmed-off OTP reference cell are fabricated substantially simultaneously.

6. The OTP memory cell read circuit of claim 1, wherein the OTP bit memory element, the programmed-on OTP reference cell, and the programmed-off OTP reference cell reside on a common integrated circuit chip.

7. The OTP memory cell read circuit of claim 1 wherein the programmed-on OTP reference cell comprises a first n-channel field effect transistor (NFET) having a source node coupled to the first input of the first current mirror, and wherein the programmed-off OTP reference cell comprises a second NFET having a source node coupled to the first input of the second current mirror.

8. A method of reading a first one-time programmable (OTP) memory cell, the method comprising:
receiving a first current amount generated by a second, programmed, OTP memory cell;
receiving a second current amount generated by a third, unprogrammed, OTP memory cell;
sinking current generated by the first OTP memory cell, wherein the amount of current sunk from the first OTP memory cell is equal to a sum of a third current amount that is proportional to the first current amount plus a fourth current amount that is proportional to the second current amount; and
comparing a voltage at a current output of the first OTP memory cell to a threshold voltage.

9. The method of claim 8, further comprising dividing the first current amount by a first predetermined value to obtain the third current amount.

10. The method of claim 9, further comprising dividing the second current amount by a second predetermined value to obtain the fourth current amount.

11. The method of claim 8, further comprising adding the first current amount to the second current amount to generate a total reference current amount, and wherein the amount of current sunk from the first OTP memory cell is determined by dividing the total reference current amount by a predetermined value.

12. The method of claim 8 wherein the first, second and third memory cells reside on a common integrated circuit chip.

13. The method of claim 8 wherein the first, second and third memory cells are manufactured substantially simultaneously.

14. The method of claim 8, further comprising subjecting the second and third OTP cells to the same stresses that the first OTP cell is subjected to.

15. The method of claim 14, wherein subjecting the second and third OTP cells to the same stresses that the first OTP cell is subjected to comprises reading the second and third OTP cells when reading the first OTP cell.

16. An apparatus comprising:
a first reference one-time programmable (OTP) cell operable to generate a reference bias current in a programmed-on configuration;
a first current mirror having a first input coupled to an output of the first reference OTP cell;
a second reference OTP cell operable to generate a reference bias current in a programmed-off configuration;
a second current mirror having a first input coupled to an output of the second reference OTP cell;
a programmable OTP bit memory element having an output coupled to a second input of the first current mirror and a second input of the second current mirror; and
a comparator having an input coupled to the output of the programmable OTP bit memory element.

17. The apparatus of claim 16, wherein the first reference OTP cell, the second reference OTP cell, and the OTP bit memory element are fabricated substantially simultaneously.

18. The apparatus of claim 16, wherein the first and second reference OTP cells, the first and second current mirrors, the programmable OTP bit memory element, and the comparator are all integrated in a single integrated circuit.

19. The apparatus of claim 16, wherein the first current mirror comprises a first field-effect transistor (FET) coupled to the output of the first reference OTP cell and a second FET coupled to the output of the programmable OTP bit memory element, wherein the gate of the first FET is coupled to the gate of the second FET, and wherein the second current mirror comprises a third FET coupled to the output of the second reference OTP cell and a fourth FET coupled to the output of the programmable OTP bit memory element, and wherein the gate of the third FET is coupled to the gate of the fourth FET.

20. The apparatus of claim 16, wherein:
if the OTP bit memory element is programmed on, a voltage at the input of the comparator approaches that of a high level voltage rail of OTP bit memory element logic; and,
if the OTP bit memory element is programmed off, a voltage at the input of the comparator approaches that of a ground of the apparatus.

* * * * *